(12) United States Patent
Kim et al.

(10) Patent No.: US 8,749,537 B2
(45) Date of Patent: Jun. 10, 2014

(54) PHOTO SENSOR AND FLAT PANEL DISPLAY DEVICE USING THEREOF

(75) Inventors: Do-Youb Kim, Suwon-si (KR); Matsueda Yojiro, Suwon-si (KR); Keum-Nam Kim, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1502 days.

(21) Appl. No.: 12/379,188

(22) Filed: Feb. 13, 2009

(65) Prior Publication Data
US 2009/0201228 A1 Aug. 13, 2009

(30) Foreign Application Priority Data
Feb. 13, 2008 (KR) .................. 10-2008-0013032

(51) Int. Cl.
G09G 3/30 (2006.01)
G01J 1/44 (2006.01)

(52) U.S. Cl.
USPC .......... 345/207; 345/175; 345/77; 250/214 C; 250/214 LS

(58) Field of Classification Search
USPC ....................................... 345/207
See application file for complete search history.

(56) References Cited

U.S. PATENT DOCUMENTS

| | | | |
|---|---|---|---|
| 4,659,930 A * | 4/1987 | Johnson et al. | 250/336.1 |
| 6,921,891 B2 * | 7/2005 | Seitz | 250/214 R |
| 7,423,639 B2 * | 9/2008 | Min | 345/207 |
| 7,620,291 B1 * | 11/2009 | Aswell | 385/147 |
| 7,898,619 B2 * | 3/2011 | Katoh et al. | 349/116 |
| 2005/0088102 A1 * | 4/2005 | Ferguson et al. | 315/149 |
| 2005/0218302 A1 * | 10/2005 | Shin et al. | 250/214 R |
| 2006/0244697 A1 * | 11/2006 | Lee et al. | 345/77 |

(Continued)

FOREIGN PATENT DOCUMENTS

CN 1885913 A 12/2006
EP 1511084 3/2005

(Continued)

OTHER PUBLICATIONS

Extended European Search Report dated Oct. 27, 2009 corresponding to the European Patent Application No. 09250383.8 which claims priority application No. 10-2008-0013032.

(Continued)

*Primary Examiner* — Joe H Cheng
*Assistant Examiner* — Benyam Ketema
(74) *Attorney, Agent, or Firm* — Robert E. Bushnell, Esq.

(57) ABSTRACT

A photo sensor that is capable of generating a photo sensing signal corresponding only to ambient light by comprehending changes in electrical current depending on the change of temperature and compensating for the electrical current according the change of temperature and a flat panel display device using the photo sensor, and the photo sensor including a photo sensing unit generating a first current corresponding to an ambient light and a second current corresponding to an ambient temperature; a temperature compensating unit including a dark diode generating a third current having a same magnitude as the second current, corresponding to the ambient temperature due to block of light to be incident; and a buffer unit outputting a light sensing signal corresponding to current having the same magnitude as the first current by subtracting the third current generated in the temperature compensating unit from the second current generated in the photo sensing unit.

19 Claims, 4 Drawing Sheets

(56) References Cited

U.S. PATENT DOCUMENTS

| | | | |
|---|---|---|---|
| 2006/0284998 A1* | 12/2006 | Park et al. | 348/308 |
| 2007/0023614 A1* | 2/2007 | Park et al. | 250/214.1 |
| 2010/0012823 A1* | 1/2010 | Ahn et al. | 250/214 R |
| 2010/0141623 A1* | 6/2010 | Nakanishi et al. | 345/207 |

FOREIGN PATENT DOCUMENTS

| | | |
|---|---|---|
| EP | 1 717 788 | 11/2006 |
| EP | 1717788 A2 | 11/2006 |
| EP | 2149914 | 2/2010 |
| JP | 08-181348 | 7/1996 |
| JP | 10-115552 | 5/1998 |
| JP | 11-312822 A | 11/1999 |
| JP | 2002-299967 | 10/2002 |
| JP | 2002-299967 A | 10/2002 |
| JP | 2002-353495 | 12/2002 |
| JP | 2006-118965 | 5/2006 |
| JP | 2007-018458 A | 1/2007 |
| JP | 2007-43689 A | 2/2007 |
| JP | 2007-65004 A | 3/2007 |
| JP | 2008-010850 | 1/2008 |
| KR | 10-2005-0067650 | 7/2005 |
| WO | 2005093700 | 10/2005 |
| WO | 2006117956 A1 | 3/2006 |
| WO | 2006/117956 | 11/2006 |
| WO | 2006117956 A1 | 11/2006 |
| WO | 2008096892 | 8/2008 |
| WO | 2008/130060 | 10/2008 |
| WO | 2008130060 A1 | 10/2008 |

OTHER PUBLICATIONS

European Office Action issued Apr. 24, 2012 in connection with European Patent Application Serial No. 10003195.4, which also claims Korean Patent Application Serial No. 10-2008-0013032 as it priority document.

The Chinese Certificate of Invention Patent issued by Chinese Patent Office, dated May 4, 2011, corresponding to Chinese Patent Application No. 200910004147.7, together with English Translation.

Chinese Office Action dated Jul. 26, 2010 of the Chinese Patent Application No. 200910004147.7. which claims priority of the corresponding Korean priority application No. 10-2008-0013032. English translation attached.

European search report on Aug. 7, 2009 in Applicant's corresponding European Patent Application No. 09250383.8.

Japanese Office action issued by Japanese Patent Office on Aug. 2, 2011, corresponding to JP 2008-079279 and Request for Entry attached herewith.

Korean Office Action issued on Oct. 30, 2009, corresponding to the Korean Priority Application No. 10-2008-0013032.

* cited by examiner

PHOTO SENSOR AND FLAT PANEL DISPLAY DEVICE USING THEREOF

CLAIM OF PRIORITY

This application makes reference to, incorporates the same herein, and claims all benefits accruing under 35 U.S.C. §119 from an application for PHOT SENSOR AND FLAT PANEL DISPLAY USING THEREOF earlier filed in the Korean Intellectual Property Office on 13 Feb. 2008 and there duly assigned Serial No. 10-2008-0013032.

BACKGROUND OF THE INVENTION

1. Field of the Invention

The present invention relates to a photo sensor, a flat panel display device using the photo sensor and a process of fabricating a dark diode, and more particularly, to a photo sensor and a flat panel display device using the photo sensor outputting a signal responding to only light.

2. Description of the Related Art

Recently, various flat panel display (FPD) devices having reduced weight and volume, which are unfavorable in a cathode ray tube (CRT), have been developed. As flat panel display devices, there are liquid crystal display devices, field emission display devices, plasma display panels, organic light emitting display devices and other related display devices.

The organic light emitting display device displays an image using an organic light emitting diode (OLED) generating light by recombination of an electron and a hole.

The organic light emitting display device has various advantages such as an excellent color representation, a thin thickness, and other related advantages, so that the organic light emitting display device is widely used in a variety of applications such as PDAs (personal digital assistants), MP3 devices, and other related electronic devices, in addition to a cellular phone.

Visibility of the displayed image on such a flat panel display device may vary with the brightness of ambient light. In other words, even though an image is displayed with the same brightness, when the brightness of the ambient light is relatively high, the displayed image may appear darker to users' bare eyes, and when the brightness of the ambient light is relatively low, the displayed image may appear brighter to users' bare eyes.

Therefore, in order to enhance visibility of the displayed image to users' bare eyes, the brightness of the ambient light is sensed, wherein when the brightness of the ambient light is relatively high, the brightness of the displayed image may be raised, and when the brightness of the ambient light is relatively low, the brightness of the displayed image may be lowered. Also, when the brightness of an image is controlled according to the brightness of the ambient light, the brightness of the displayed image will not be unnecessarily raised, and thus possibly reducing the power consumption of the display device.

Based on the reasons mentioned above, there has been contrived a method to control the brightness of the displayed image corresponding to the ambient light by attaching a photo sensor sensing the ambient light to a flat panel display device.

The photo sensor includes a photodiode, which is sensitive to the temperature. Therefore, when the ambient temperature rises to a predetermined degree, an electrical current generated by temperature becomes significantly larger than an electrical current generated by light in the photodiode so that the electrical currents generated by light may be ignored.

Therefore, in order to complement brightness corresponding to the ambient light for the display device, the electrical current generated from the photodiode should be compensated by temperature.

SUMMARY OF THE INVENTION

It is therefore an object of the present invention to provide a photo sensor, a flat panel display device using the photo sensor and a process of fabricating a dark diode in order to solve the problems as stated above.

It is another object of the present invention to provide a photo sensor and a flat panel display device using the photo sensor that is capable of generating a photo sensing signal corresponding only to ambient light by comprehending changes in an electrical current induced by a temperature change and compensating for the electrical current according the temperature change.

In order to accomplish the above object, in accordance with a first aspect of the present invention, a photo sensor may be constructed with a photo sensing unit generating a first electrical current corresponding to ambient light and a second electrical current corresponding to ambient temperature; a temperature compensating unit including a dark diode generating a third electrical current having the same magnitude as the second electrical current, corresponding to ambient temperature due to block of light to be incident; and a buffer unit outputting a light sensing signal corresponding to electrical current having the same magnitude as the first electrical current by subtracting the third electrical current generated in the temperature compensating unit from the second electrical current generated in the photo sensing unit.

In order to accomplish the above object, in accordance with a second aspect of the present invention, a flat panel display device may be constructed with a pixel unit displaying an image by corresponding to a data signal and a scan signal; a photo sensor generating a light sensing signal by sensing ambient light; a data driver generating the data signal corresponding to the light sensing signal; and a scan driver generating the scan signal, wherein the photo sensor includes: a photo sensing unit generating a first electrical current corresponding to ambient light and a second electrical current corresponding to an ambient temperature; a temperature compensating unit including a dark diode generating a third electrical current having the same magnitude as the second electrical current, corresponding to the ambient temperature due to block of light to be incident; and a buffer unit outputting a light sensing signal corresponding to an electrical current having the same magnitude as the first electrical current by subtracting the third electrical current generated in the temperature compensating unit from the second electrical current generated in the photo sensing unit.

In order to accomplish the above object, in accordance with a second aspect of the present invention, a dark diode may be constructed with a transparent substrate; a buffer layer formed on the transparent substrate; a semiconductor layer formed on the buffer layer; a first insulating film formed on the semiconductor layer; a second insulating film on the first insulating film; first and second metal electrodes formed on the second insulating film and contacted to both ends of the semiconductor layer, respectively; a third insulating film formed on the first and second metal electrodes; a planarization film formed on the third insulating film; and an anode electrode formed on the planarization film and opposed to the semiconductor layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Figure 1:
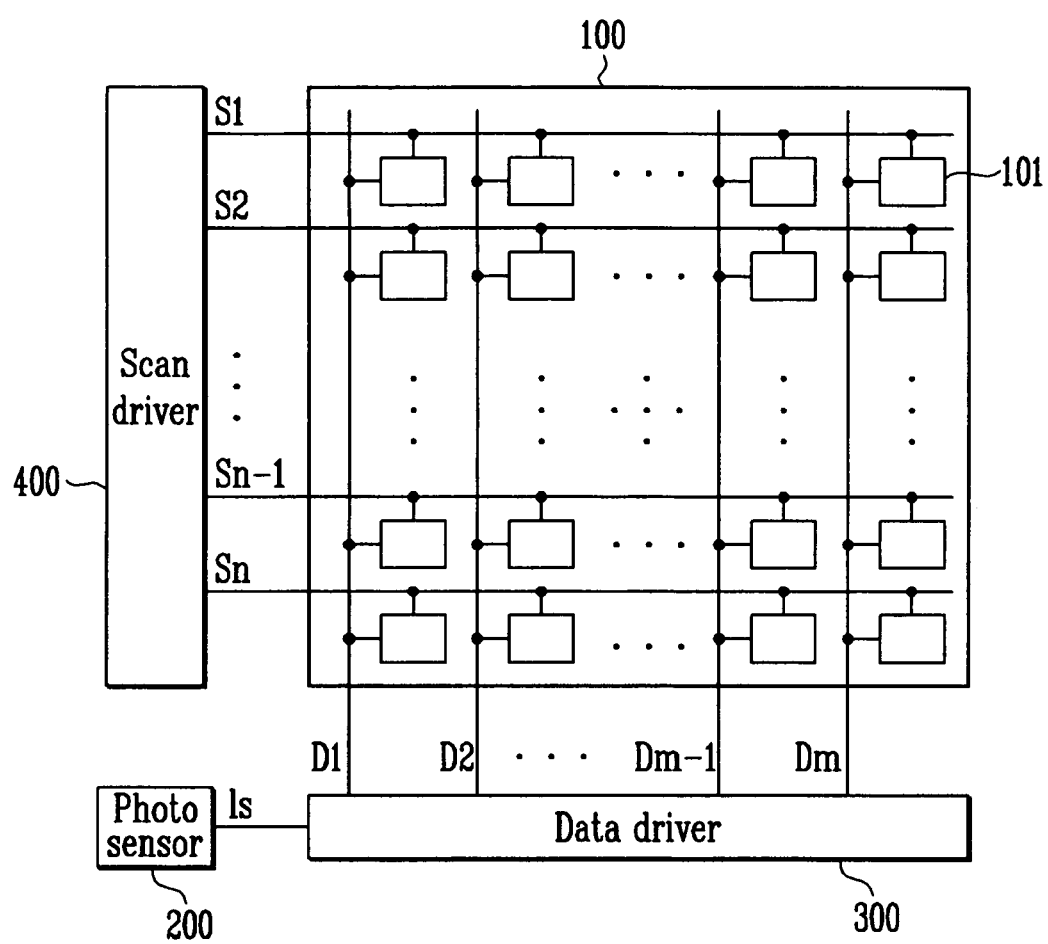
FIG. 1 is a schematic view illustrating a structure of an organic light emitting display device, which is one example of a flat panel display device constructed as the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. When a first element is described as being coupled to a second element, the first element may be not only directly coupled to the second element but may also be indirectly coupled to the second element via a third element. Also, when an element is referred to as being "connected to" another element, it can be directly connected to the element or be indirectly connected to the element with one or more intervening elements interposed therebetween. Hereinafter, like reference numerals refer to like element.

Hereinafter, exemplary embodiments in accordance with the present invention will be described with reference to the accompanying drawings.

FIG. 1 illustrates a structure of an organic light emitting display device, which is one example of a flat panel display device constructed as the present invention. Referring to FIG. 1, the organic light emitting display device includes a pixel unit 100, a photo sensor 200, a data driver 300, and a scan driver 400.

Pixel unit 100 is arranged with a plurality of pixels 101, wherein each pixel 101 includes an organic light emitting diode (not shown) emitting light corresponding to flow of current. Also, pixel unit 100 is arranged with a number of n scan lines S1, S2, ..., Sn-1 and Sn formed in a row direction and transferring scan signals, and a number of m data lines D1, D2, ..., Dm-1 and Dm formed in a column direction and transferring data signals.

Such a pixel unit 100 is driven by receiving a first power and a second power from the external. In other words, pixel unit 100 generates light by means of driving current flowing on the organic light emitting diode by means of the scan signals, the data signals, the first power and the second power, to display an image.

Photo sensor 200 generates a light sensing signal is sensing ambient light and controlling brightness of an image displayed on pixel unit 100 corresponding to the brightness of the ambient light which may have high brightness or low brightness. The light sensing signal 1s is transferred to data driver 300. Data driver 300 then generates a data signal corresponding to the light sensing signal 1s.

Data driver 300, which is a means for generating a data signal, receives video signals R, G and B data having red, blue, and green components, and the light sensing signal Is to generate a data signal. Data driver 300 connected to the data lines D1, D2, ..., Dm-1, and Dm applies the data signals to pixel unit 100.

Scan driver 400, which is a means for generating a scan signal, is connected to the scan signals S1, S2, ..., Sn-1, and Sn to transfer scan signals to a specific row of pixel unit 100. Pixel 101 transferred with the scan signals is transferred with the data signals output from data driver 300 so that a driving electrical current is generated. The generated driving electrical current is flown on organic light emitting diodes.

Figure 2:
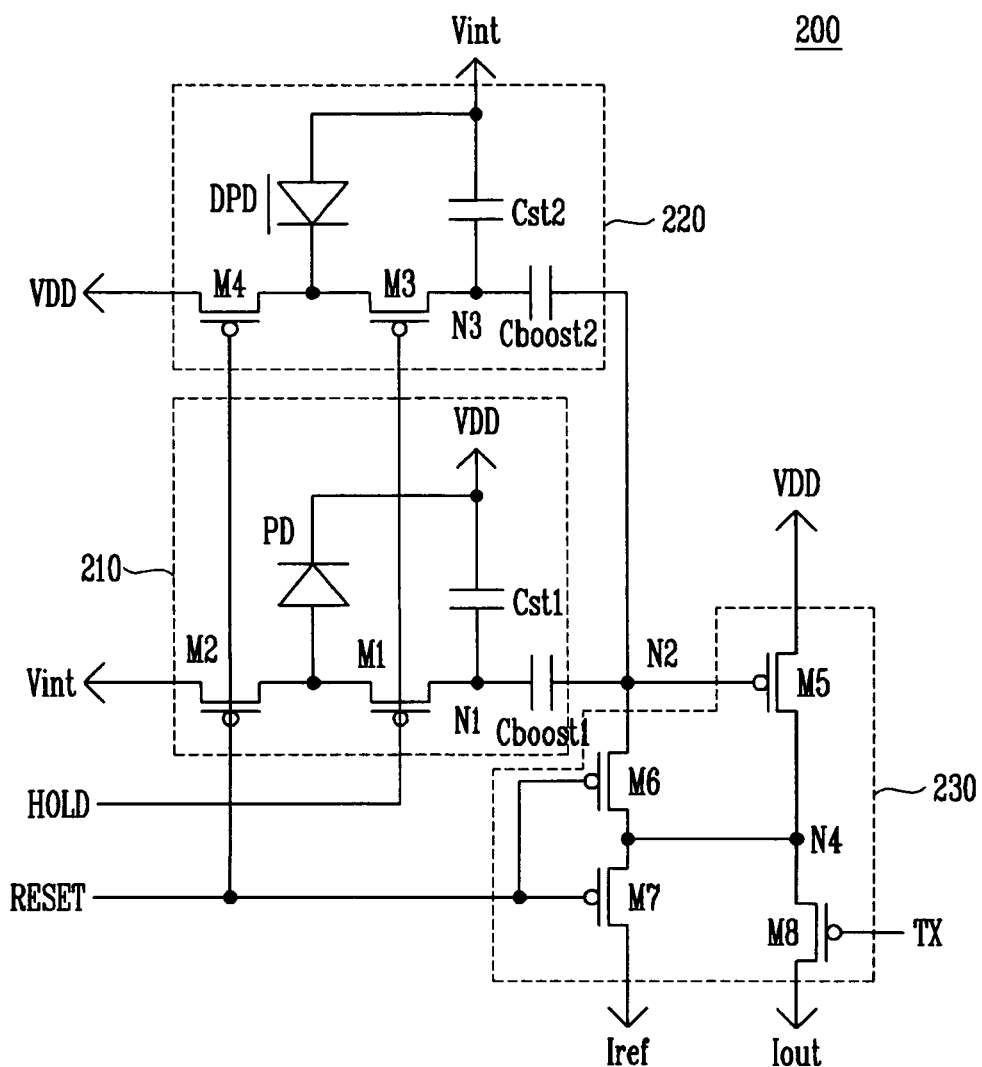
FIG. 2 is a schematic diagram illustrating a circuit constructed as a first embodiment of a photo sensor adopted to the organic light emitting display device of FIG. 1.

FIG. 2 is a schematic view illustrating a circuit constructed as a first embodiment of a photo sensor adopted to the organic light emitting display device of FIG. 1. Referring to FIG. 2, photo sensor 200 includes a photo sensing unit 210, a temperature compensating unit 220, and a buffer unit 230.

Photo sensing unit 210 includes a photodiode PD. The photodiode PD generates electrical current corresponding to the brightness of the ambient light. In other words, if the ambient light is incident to the photodiode PD, the electrical current corresponding thereto flows in a direction from a cathode electrode to an anode electrode, the flowing electrical current intensity corresponding to the brightness of the ambient light. Here, the photodiode is also sensitive to the temperature so that the electrical current generated from the photodiode PD may vary according to the temperature change.

More specifically, photo sensing unit 210 includes the photodiode PD, a first transistor M1, a second transistor M2, a first capacitor Cst1, and a second capacitor Cboost1.

A cathode electrode of the photodiode PD is electrically connected to a driving power supply, and an anode electrode thereof is electrically connected to a drain electrode of the first transistor M1 and a source electrode of the second transistor M2.

A source electrode of the first transistor M1 is electrically connected to a first node N1, a drain electrode of the first transistor M1 is connected to the anode electrode of the photodiode PD, and a gate electrode thereof is electrically connected to a first control line HOLD.

A source electrode of the second transistor M2 is electrically connected to the anode electrode of the photodiode D, a drain electrode of the second transistor M2 is electrically connected to a initialization signal line Vint, and a gate electrode thereof is electrically connected to a reset signal line RESET.

A first electrode of the first capacitor Cst1 is electrically connected to a driving power supply VDD, and a second electrode of the first capacitor Cst1 is electrically connected to the first node N1. A first electrode of the second capacitor Cboost1 is electrically connected to the first node N1 and a second electrode of the second capacitor Cboost1 is electrically connected to a second node N2.

Figure 4:
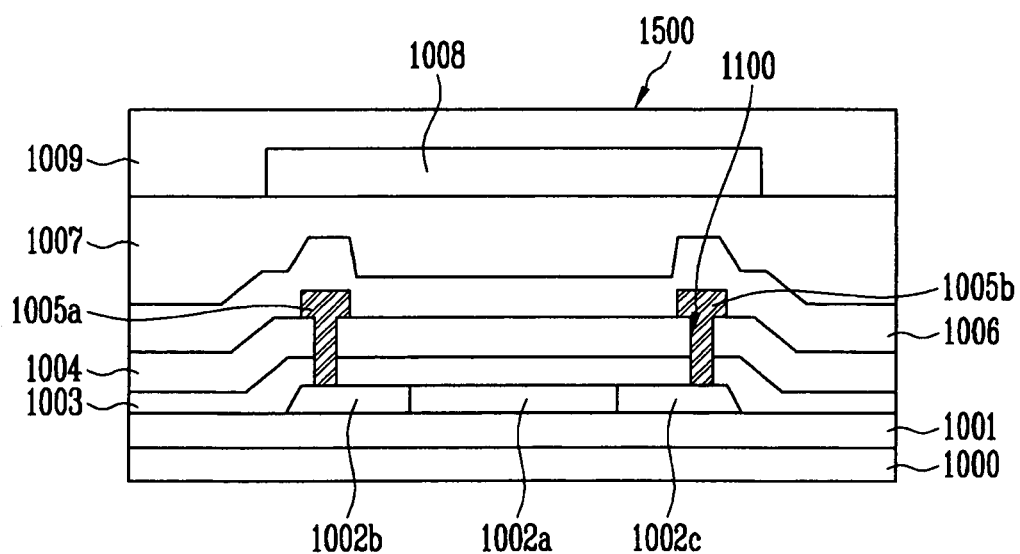
FIG. 4 is a cross-sectional view showing a first embodiment of a dark diode adopted to the photo sensor of FIG. 2.

Temperature compensating unit 220 has the same structure as photo sensing unit 210, and blocks the ambient light from being incident to the photodiode to generate the electrical current corresponding to temperature. Dark diode DPD has one or more reflective layers between, for example, the protective layer 1009 and transparent substrate 1000 (for example, anode electrode 1008 which is a highly reflective layer because that layer is made from metal as shown in FIG. 4) that prevent incident ambient light 1500 from being impingent on dark diode DPD, therefore dark diode DPD only generates an electrical current corresponding to the ambient temperature. As light is not impingent on the dark diode DPD included in temperature compensating unit 220, only the electrical current having an amplitude that varies according to the ambient temperature surrounding the DPD diode, flows on the dark diode DPD. Therefore, when the electrical current generated in temperature compensating unit 220 is subtracted from the electrical current generated in photo sensing unit 210, the resulting electrical current is the electrical current generated corresponding to the ambient light.

More specifically, temperature compensating unit 220 includes the dark diode DPD, a third transistor M3, a fourth transistor M4, a third capacitor Cst2, and a fourth capacitor Cboost2.

An anode electrode of the dark diode DPD is electrically connected to an initialization power supply Vint, a cathode electrode of the dark diode DPD is electrically connected to a drain electrode of the third transistor M3 and a source electrode of the fourth transistor M4.

A source electrode of the third transistor M3 is electrically connected to a third node N3, a drain electrode the third transistor M3 is connected to a cathode electrode of the dark diode DPD, and a gate electrode the third transistor M3 is electrically connected to a first control line HOLD.

A source electrode of the fourth transistor M4 is electrically connected to a cathode electrode of the dark diode DPD, a drain electrode of the fourth transistor M4 is electrically connected to a driving power supply VDD, and a gate electrode of the fourth transistor M4 is electrically connected to a reset signal line RESET.

A first electrode of the third capacitor Cst2 is electrically connected to an initialization power supply Vint, and a second electrode of the third capacitor Cst2 is electrically connected to a third node N3.

A first electrode of the fourth capacitor Cboost2 is electrically connected to a third node is N3, and a second electrode thereof is electrically connected to a second node N2.

Buffer unit 230 subtracts the electrical current generated in temperature compensating unit 220 from the electrical current generated in photo sensing unit 210. Buffer 230 subtracts the electrical current generated by temperature from the electrical current generated by the ambient light and the electrical current generated by temperature in photo sensing unit 210 to generate the electrical current corresponding only to the ambient light regardless of temperature. Also, buffer unit 230 may improve the property of the generated electrical current.

More specifically, buffer unit 230 includes a fifth transistor M5, a sixth transistor M6, a seventh transistor M7, and an eighth transistor M8.

A source electrode of the fifth transistor M5 is electrically connected to a driving power supply VDD, a drain electrode of the fifth transistor M5 is electrically connected to a fourth node N4, and a gate electrode of the fifth transistor M5 is electrically connected to a second node N2.

A source electrode of the sixth transistor M6 is electrically connected to the second node N2, a drain electrode of the sixth transistor M6 is electrically connected to the fourth node N4, and a gate electrode of the sixth transistor M6 is electrically connected to a reset signal line RESET.

A source electrode of the seventh transistor M7 is electrically connected to the fourth node N4, a drain electrode of the seventh transistor M7 is electrically connected to a first output line Iref, and a gate electrode of the seventh transistor M7 is electrically connected to the reset signal line RESET.

A source electrode of the eighth transistor M8 is electrically connected to the fourth node N4, a drain electrode of the eighth transistor M8 is connected to a second output line Iout, and a gate electrode of the eighth transistor M8 is electrically connected to a second control line TX.

Figure 3:
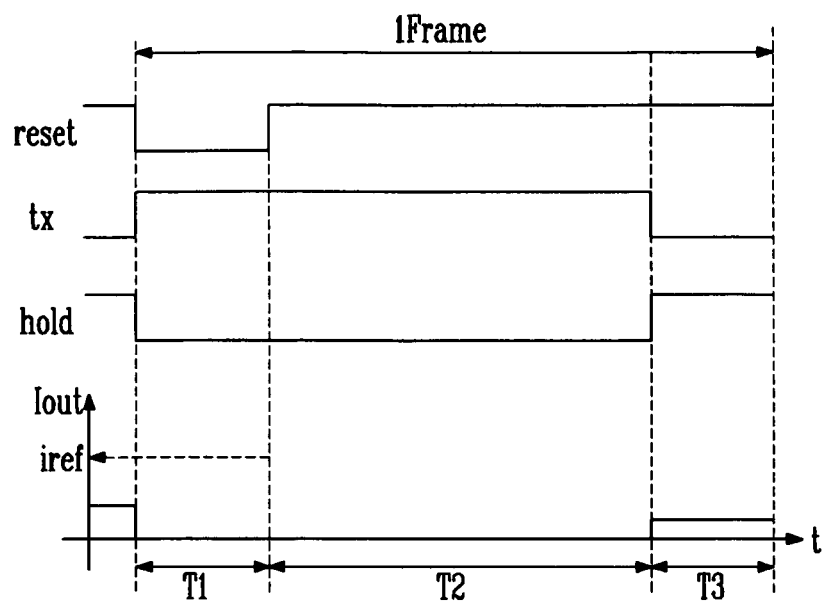
FIG. 3 is a group of waveforms illustrating an operation of the photo sensor of FIG. 2.

FIG. 3 is a group of waveforms illustrating an operation of the photo sensor of FIG. 2.

Referring to FIG. 3, photo sensor 200 operates by a reset period T1, an integration period T2, and a sampling period T3.

In the reset period T1, a reset signal reset transferred through a reset signal line RESET is low, a second control signal tx transferred through a second control line TX is high, and a first control signal hold transferred through a first control line HOLD is low.

In the integration period T2, the reset signal reset is high, the second control signal tx is high, and the first control signal hold is low.

In the sampling period T3, the reset signal reset is high, the second control signal tx is low, and the first control signal hold is high.

First, in the reset period T1, the reset signal reset and the first control signal hold are low, and the second control signal tx is high so that the first transistor M1, the second transistor M2, the third transistor M3, the fourth transistor M4, the sixth transistor M6, and the seventh transistor M7 turns on, and the eighth transistor M8 turn off. Therefore, the first capacitor Cst1 and the second capacitor Cboost1 are initialized by means of initialization voltage, and a third capacitor Cst2 and a fourth capacitor Cboost2 are initialized by means of voltage of a driving voltage VDD. When reference electrical current iref flows through a first output terminal Tref electrically connected to a drain electrode of the seventh transistor M7, the second node N2 has a predetermined voltage Vref corresponding to current amount of the reference current iref. Such a predetermined voltage Vref is maintained by means of the first capacitor Cst1, the second capacitor Cboost1, the third capacitor Cst2, and the fourth capacitor Cboost2. Here, the predetermined voltage is the voltage applied to a gate electrode of the fifth transistor M5 so that the reference current iref flows. When the transistor M8 is turned off, the transistor M7 is turned on to allow an electric current Tref to flow through the drain of the transistor M7. When the electric current Tref flows through the drain of the transistor M7, the electric current Tref cones to flow through the drain of the transistor M5 since the node N4 is electrically connected to the source of the transistor M7. An electric current flowing through to drain of transistor being determined by a voltage between the sources and the gate of the transistor, if the electric current Tref flows through the drain of the transistor M5, a voltage to allow the current Tref to flow through the date of transistor M5 is applied. Here, the voltage applied to the transistor M5 is determined by the electric current Tref, regardless of the threshold voltage of transistor M5.

In the integration period T2, the first control signal hold is low and the second control signal tx and the reset signal reset are high so that the first transistor M1 and the third transistor M3 maintain a turn-on state, and the second transistor M2 and the fourth transistor M4 maintain a turn-off state. Therefore, on the photodiode PD, current flows in a direction from a cathode electrode of the photodiode PD to an anode electrode of the photodiode PD by means of the incident light and the ambient temperature. On the dark diode DPD, current flows in a direction from a cathode electrode to an anode electrode by means of the ambient temperature. At this time, among the current flowing on the photodiode PD, the current flowing corresponding to the incident light is referred to a first current, and the current flowing corresponding to the ambient temperature is referred to a second current. Also, the current flowing on the dark diode DPD corresponding to ambient temperature is referred to a third current.

The first current and the second current flown by means of the photodiode PD flow to the first node N1. The third current flown by means of the dark diode DPD flows from the third node N3 to the initialization power line Vint through the dark diode DPD. At this time, the photodiode PD and the dark diode DPD are formed in the same process so that the second current and the third current generated by temperature have the same amount of current.

Voltage of the first node N1 is increased by means of the first current and the second current flowing in the photodiode PD, and voltage of the third node N3 is decreased by means of the third current flowing in the dark diode DPD. Here, the second current and the third current are the same in view of the magnitude and opposite in view of the direction. Therefore, the extent where voltage of the first node N1 is increased by means of the second current and the extent where voltage of the third node N3 is decreased by means of the third current become the same. Therefore, voltage of the second node N2 coupled with the first node N1 and the third node N3 through the first and second capacitors Cst1 and Cboost1 and the third and fourth capacitors Cst2 and Cboost2 is increased corresponding to the magnitude of the first current.

Therefore, voltage of Vref+$_A$V (extent of voltage change in the first node N1 by means of the first current) is applied to the second node N2. At this time, the eighth transistor M8 is a turn-off state, making it possible to prevent current from flowing through a second output terminal Iout corresponding to the voltage applied to the second node N2. Therefore, no current is present at second output terminal Iout at period T2.

In the sampling period T3, the reset signal reset and the control signal hold are high and the second control signal tx is low so that the eighth transistor M8 turns on. Therefore, the photodiode PD is disconnected with the first node N1, and the dark diode DPD is disconnected with the third node N3. Therefore, the voltage of the second node N2 is not changed any further by means of the first capacitor Cst1 and the second capacitor Cboost1, and the third capacitor Cst2 and the fourth capacitor Cboost2. The second output terminal Iout is kept in connection with the drain electrode of the fifth transistor M5 by means of the eighth transistor M8. Accordingly, current flows in a direction from the source electrode of the fifth transistor M5 to the drain electrode thereof. Such current flows corresponding to the voltage at the second node N2 passing through the second output terminal Iout to the exterior of photo sensor 200 is used as a light sensing signal.

FIG. 4 is a cross-sectional view showing a first embodiment of a dark diode adopted to the photo sensor of FIG. 2. Referring to FIG. 4, a buffer layer 1001 and a semiconductor layer including three regions, i.e., semiconductor regions 1002a, 1002b, and 1002c, are sequentially formed on a transparent substrate 1000. Then, a first insulating film 1003 is formed on buffer layer 1001 and the semiconductor layer. Here, semiconductor regions 1002b and 1002c are located at two end portions of the semiconductor layer respectively and semiconductor region 1002a is located at middle portions of the semiconductor layer. Semiconductor region 1002a may be covered by a mask or related tools, and an ion doping process may be then performed. One of semiconductor region 1002b and semiconductor region 1002c may become N-type, and the other one may become P-type after the doping process, and semiconductor region 1002a is not ion-doped to become an intrinsic semiconductor region. Subsequently, a second insulating film 1004 is formed on first insulating film 1003, and contact holes 1100 penetrating first insulating film 1003 and second insulating film 1004 are formed. A metal layer is formed on second insulating film 1004 and then patterned to become first and second metal electrodes 1005a and 1005b. First and second metal electrodes 1005a and 1005b each electrically coupled with P-type semiconductor region 1002b and N-type semiconductor region 1002c of the semiconductor layers through contact holes 1100. After first and second metal electrodes 1005a and 1005b are formed, a third insulating film 1006 is formed and a planarization layer 1007 is formed on third insulating film 1006. An anode electrode 1008 of the organic light emitting display device is formed on planarization layer 1007, and a protective film 1009 or the like is formed planarization layer 1007.

In the dark diode DPD formed as above, light is reflected by means of anode electrode 1008 so that light may not be incident to the dark diode DPD. Therefore, the dark diode DPD generates only current according to temperature change.

Figure 5:
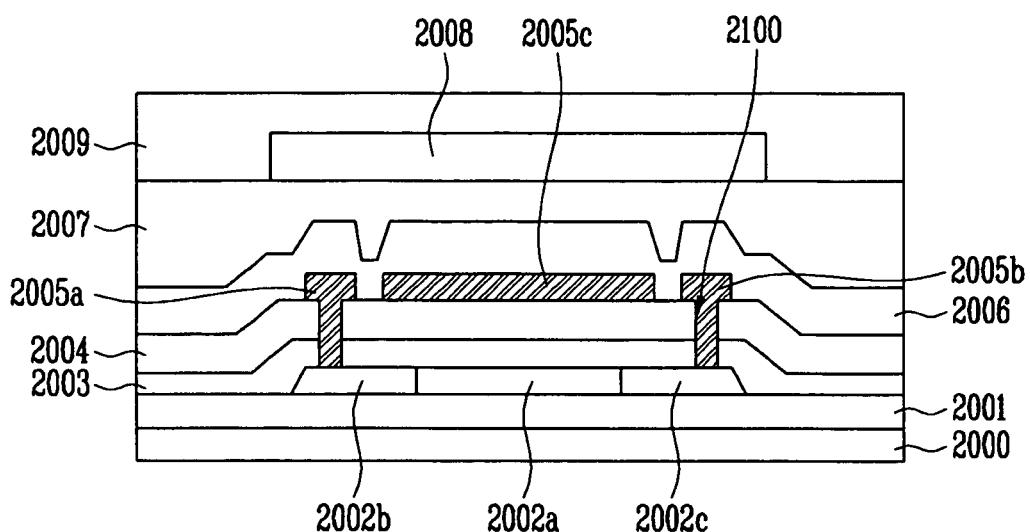
FIG. 5 is a cross-sectional view showing a second embodiment of the dark diode adopted to the photo sensor of FIG. 2.

FIG. 5 is a cross-sectional view showing a second embodiment of a dark diode adopted to the photo sensor of FIG. 2. Referring to FIG. 5, a buffer layer 2001 and a semiconductor layer including three regions, i.e., semiconductor regions 2002a, 2002b, and 2002c, are sequentially formed on a transparent substrate 2000. Then, a first insulating film 2003 is formed on buffer layer 2001 and the semiconductor layer. Here, semiconductor regions 2002b and 2002c are located at two end portions of the semiconductor layer respectively and semiconductor region 2002a is located at middle portions of the semiconductor layer. Semiconductor region 2002a may be covered by a mask or related tools, and an ion doping process may be then performed. One of semiconductor region 2002b and semiconductor region 2002c may become N-type, and the other one may become P-type after the doping process, and semiconductor region 2002a is not ion-doped to become an intrinsic semiconductor region. A second insulating film 2004 is formed on first insulating film 2003, and contact holes 2100 penetrating first insulating film 2003 and second insulating film 2004 are formed. Subsequently, a metal layer is formed thereon and then patterned to form first, second, and third metal electrodes 2005a, 2005b and 2005c. The first and second metal electrodes 2005a and 2005b each electrically coupled to the P-type semiconductor region and N-type semiconductor region of the semiconductor layer through contact holes 2100, and the third metal electrode 2005c is formed opposite to and spaced apart from intrinsic semiconductor region 2002a of the semiconductor layers. A third insulating film 2006 is formed on the first, second and third metal electrodes 2005a, 2005b, and 2005c, and a planarization layer 2007 is formed on the third insulating film 2006. An anode electrode 2008 of the organic light emitting display device is formed on planarization layer 2007, and a protective film 2009 or the like is formed planarization layer 2007.

In the dark diode DPD of FIG. 4, even though light are reflected by means of anode electrode 1008, a portion of light may still be incident to the dark diode DPD. Therefore, in order to solve this problem, in the dark diode of FIG. 5, the third metal electrode 2005c is formed between anode electrode 2008 and the semiconductor layer having semiconductor regions 2002a, 2002b, and 2002c. Accordingly, a portion of light passing through anode electrode 2008 is blocked by means of metal electrode 2005c not to be incident to the semiconductor layer. Therefore, the dark diode DPD of FIG.

5 may enhance the reduction of the effect by means of light compared to the dark diode of FIG. 4.

Figure 6:
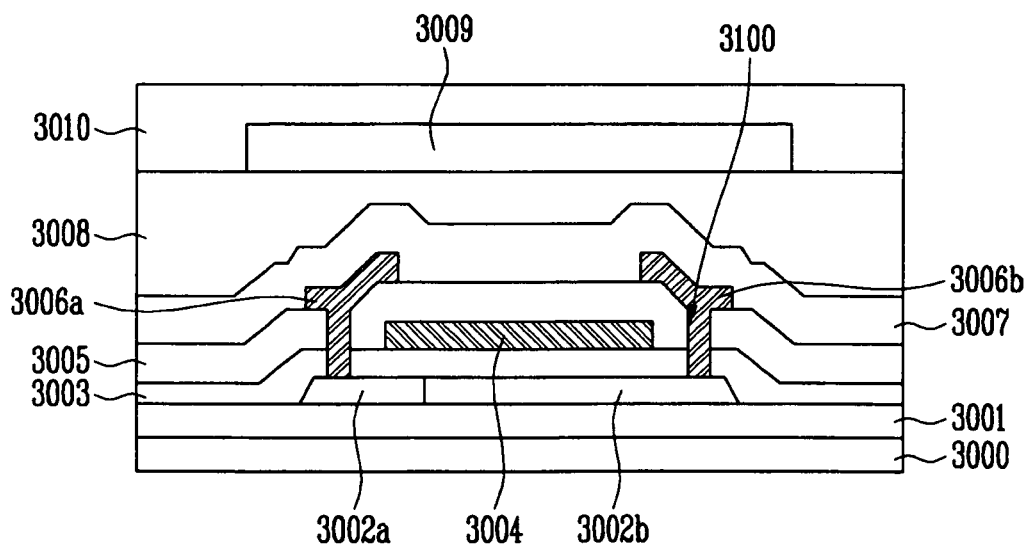
FIG. 6 is a cross-sectional view showing a third embodiment of the dark diode adopted to the photo sensor of FIG. 2.

FIG. 6 is a cross-sectional view showing a third embodiment of a dark diode adopted to the photo sensor of FIG. 2. Referring to FIG. 6, a buffer layer 3001 and a semiconductor layer having semiconductor regions 3002a and 3002b are sequentially formed on a substrate 3000. Then, a first insulating film 3003 is formed on the semiconductor layer, and an ion doping process is performed. The semiconductor layer are divided into two portions 3002a and 3002b by means of the ion doping process. In other words, semiconductor region 3002a may become a P-type semiconductor region and semiconductor region 3002b may become an intrinsic semiconductor region.

A metal layer is formed on first insulating film 3003 and is patterned to form a third metal electrode 3004 in a predetermined region. Third metal electrode 3004 is formed opposite to and spaced apart from the semiconductor layer, and is positioned to cover the middle portions of the semiconductor layer.

A second insulating film 3005 is formed on third metal electrode 3004. After second insulating film 3005 is formed, contact holes 3100 penetrating first insulating film 3003 and second insulating film 3005 is formed, and a metal layer is formed on second insulating film 3005. The metal layer is patterned to form first and second metal electrodes 3006a and 3006b. At this time, the first and second metal electrodes 3006a and 3006b each electrically coupled with both end portions of semiconductor layers 3002a and 3002b by means of contact holes 3100. Also, the first and second metal electrodes 3006a and 3006b are formed to be overlapped with the third metal electrode 3004. Accordingly, the semiconductor layer is completely covered by means of the first, second and third metal electrodes 3006a, 3006b, and 3006c. After the first and second metal electrodes 3006a and 3006b are formed, a third insulating film 3007 is formed and a planarization layer 3008 is formed on the third insulating film 3007. An anode electrode 3009 of the organic light emitting display device is formed on the planarization layer, and a protective film 3010 or the like is formed thereon.

With a photo sensor and a flat panel display device using the photo sensor constructed as the present invention as described above, electrical current according to temperature change may be compensated so that the photo sensor may generate information only on the change of the ambient light.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A photo sensor, comprising: a photo sensing unit generating a first electrical current corresponding to an ambient light and a second electrical current corresponding to an ambient temperature;
   a temperature compensating unit comprising a dark diode generating a third electrical current having a same magnitude as the second electrical current, with the second electrical current having an amplitude that varies according to the ambient temperature surrounding the dark diode by blocking of light to be impingent on the dark diode; and
   a buffer unit outputting a light sensing signal corresponding to a fourth electrical current having the same magnitude as the first current by subtracting the third current generated at the temperature compensating unit from a sum of the first and second currents generated at the photo sensing unit,
   in which, in the photo sensing unit, a cathode electrode of the photodiode is connected with a voltage of a driving power supply and an anode electrode of the photodiode is connected with a voltage of an initialization power supply; and
   in the temperature compensating unit, an anode electrode of the dark diode is connected with the voltage of the initialization power supply and a cathode electrode of the dark diode is connected with the voltage of the driving power supply.

2. The photo sensor as claimed in claim 1, in which the photo sensing unit and the temperature compensating unit are supplied with a reset signal and a first control signal, and the buffer unit is supplied with a second control signal, with the reset signal being low during a first period and being high during second and third periods, the first control signal being low during the first and second periods and being high during the third period, and the second control signal being high during the first and second periods and being low during the third period.

3. The photo sensor as claimed in claim 2, with the photo sensing unit further comprising:
   the photodiode of which the cathode electrode is connected with the voltage of the driving power supply and the anode electrode is connected with the initialization power supply;
   a first transistor of which a first electrode is electrically connected to the anode electrode of the photodiode, a second electrode is electrically connected to a first node, and a gate electrode is electrically connected to a first control line supplied with the first control signal;
   a second transistor of which a first electrode is electrically connected to an initialization signal line connected with the initialization power supply, a second electrode is electrically connected to the anode electrode of the photodiode, and a gate electrode is electrically connected to a reset signal line supplied with the reset signal;
   a first capacitor of which a first electrode is electrically connected to the cathode electrode of the photodiode and a second electrode is electrically connected to a first capacitor electrically connected to the first node; and
   a second capacitor of which a first electrode is electrically connected to the first node and a second electrode is electrically connected to the second node.

4. The photo sensor as claimed in claim 2, with the temperature compensating unit further comprising:
   the dark diode of which the anode electrode is electrically connected to the initialization signal line connecting to the initialization power supply and the cathode electrode is connected with the voltage of the driving power supply;
   a third transistor of which a first electrode is electrically connected to the cathode electrode of the dark diode, a second electrode is electrically connected to a third node, and a gate electrode is electrically connected to the first control line supplied with the first control signal;
   a fourth transistor of which a first electrode is connected with voltage of the driving power supply, a second electrode is electrically connected to the cathode electrode of the dark diode, and a gate electrode is electrically connected to the reset signal line supplied with the reset signal;

a third capacitor of which a first electrode is electrically connected to the anode electrode of the dark diode and a second electrode is electrically connected to the third node; and a fourth capacitor of which a first electrode is electrically connected to the third node and a second electrode is electrically connected to the second node.

5. The photo sensor as claimed in claim 2, with the buffer unit further comprising:

a fifth transistor of which a first electrode is electrically connected to the driving power supply, a second electrode is electrically connected to a fourth node, and a gate electrode is electrically connected to a second node;

a sixth transistor of which a first electrode is electrically connected to the second node, a second electrode is electrically connected to the fourth node, and a gate electrode is electrically connected to a reset signal line supplied with the reset signal;

a seventh transistor of which a first electrode is electrically connected to the fourth node, a second electrode is electrically connected to a first output line, and a gate electrode is electrically connected to the reset signal line; and an eighth transistor of which a first electrode is electrically connected to the fourth node, a second electrode is electrically connected to a second output line, and a gate electrode is electrically connected to a second control signal line supplied with the second control signal.

6. The photo sensor as claimed in claim 1, with the dark diode further comprising a semiconductor layer and a metal layer formed the semiconductor layer.

7. The photo sensor as claimed in claim 6, with the dark diode further comprising first, and second metal electrodes disposed between the semiconductor layer and the metal layer with the first and second metal electrodes being electrically insulated.

8. The photo sensor as claimed in claim 7, with the dark diode further comprising a third metal electrode disposed between the semiconductor layer and the metal layer.

9. The photo sensor as claimed in claim 8, with the dark diode further comprising an electrical insulating film formed between the first and second metal electrodes and the third metal electrode.

10. The photo sensor as claimed in claim 9, in which the first and second metal electrodes are overlapped with and electrically insulated from the third metal electrode.

11. A flat panel display device, comprising:

a pixel unit displaying an image corresponding to a data signal and a scan signal;

a photo sensor generating a light sensing signal by sensing an ambient light;

a data driver generating the data signal corresponding to the light sensing signal; and a scan driver generating the scan signal;

the photo sensor comprising:

a photo sensing unit generating a first current corresponding to an ambient light and a second current corresponding to an ambient temperature;

a temperature compensating unit comprising a dark diode generating a third current having a same magnitude as the second current, with the second electrical current having an amplitude that varies according to the ambient temperature surrounding the dark diode by blocking of light to be impingent on the dark diode; the dark diode comprising a semiconductor layer and a metal layer formed on the semiconductor layer; and a buffer unit outputting a light sensing signal corresponding to a fourth current having the same magnitude as the first current by subtracting the third current generated in the temperature compensating unit from a sum of the first and second currents generated in the photo sensing unit, in which, in the photo sensing unit, a cathode electrode of the photodiode is connected with a voltage of a driving power supply and an anode electrode of the photodiode is connected with a voltage of an initialization power supply; and in the temperature compensating unit, an anode electrode of the dark diode is connected with the voltage of the initialization power supply and a cathode electrode of the dark diode is connected with the voltage of the driving power supply.

12. The flat panel display device as claimed in claim 11, in which the photo sensing unit and the temperature compensating unit are supplied with a reset signal and a first control signal, and the buffer unit is supplied with a second control signal, with the reset signal being low in a first period and being high in second and third periods, the first control signal being low in the first and second periods and being high in the third period, and the second control signal being high in the first and second periods and being low in the third period.

13. The flat panel display device as claimed in claim 12, with the photo sensing unit further comprising:

the photodiode of which the cathode electrode is connected with the voltage of the driving power supply and the anode electrode is connected with the initialization power supply;

a first transistor of which a first electrode is electrically connected to the anode electrode of the photodiode, a second electrode is electrically connected to a first node, and a gate electrode is electrically connected to a first control line supplied with the first control signal;

a second transistor of which a first electrode is electrically connected to an initialization signal line connected with the initialization power supply, a second electrode is electrically connected to the anode electrode of the photodiode, and a gate electrode is electrically connected to a reset signal line supplied with the reset signal;

a first capacitor of which a first electrode is electrically connected to the cathode electrode of the photodiode and a second electrode is electrically connected to a first capacitor electrically connected to the first node; and second capacitor of which a first electrode is electrically connected to the first node and a second electrode is electrically connected to the second node.

14. The flat panel display device as claimed in claim 12, with the temperature compensating unit further comprising:

the dark diode of which an anode electrode is electrically connected to the initialization signal line connecting to the initialization power supply and a cathode electrode is connected with the voltage of the driving power supply;

a third transistor of which a first electrode is electrically connected to the cathode electrode of the dark diode, a second electrode is electrically connected to the third node, and a gate electrode is electrically connected to the first control line supplied with the first control signal;

a fourth transistor of which a first electrode is connected with the voltage of the driving power supply, a second electrode is electrically connected to the cathode electrode of the dark diode, and a gate electrode is electrically connected to the reset signal line supplied with the reset signal;

a third capacitor of which a first electrode is electrically connected to the anode electrode of the dark diode and a second electrode is electrically connected to the third node; and a fourth capacitor of which a first electrode is electrically connected to the third node and a second electrode is electrically connected to the second node.

15. The flat panel display device as claimed in claim 12, with the buffer unit further comprising:

a fifth transistor of which a first electrode is electrically connected to the driving power supply, a second electrode is electrically connected to a fourth node, and a gate electrode is electrically connected to a second node;

a sixth transistor of which a first electrode is electrically connected to the second node, a second electrode is electrically connected to the fourth node, and a gate electrode is electrically connected to a reset signal line supplied with the reset signal;

a seventh transistor of which a first electrode is electrically connected to the fourth node, a second electrode is electrically connected to a first output line, and a gate electrode is electrically connected to the reset signal line; and an eighth transistor of which a first electrode is electrically connected to the fourth node, a second electrode is electrically connected to a second output line, and a gate electrode is electrically connected to a second control signal line supplied with the second control signal.

16. The flat panel display device as claimed in claim 11, with the dark diode further comprising first and second metal electrodes formed between the semiconductor layer and the metal layer with the first metal electrode being electrically insulated from the second metal electrode.

17. The flat panel display device as claimed in claim 16, with the dark diode further comprising a third metal electrodes formed between the semiconductor layer and the metal layer with the third metal electrode being electrically insulated from the first and second metal electrodes.

18. The flat panel display device as claimed in claim 17, with the dark diode further comprising an electrical insulating film formed between the first and second metal electrodes and the third metal electrode.

19. The flat panel display device as claimed in claim 18, wherein the first and second metal electrodes are overlapped with and electrically insulated from the third metal electrode.

* * * * *